United States Patent [19]

Milano

[11] Patent Number: 4,550,331
[45] Date of Patent: Oct. 29, 1985

[54] MULTILAYER MODULATION DOPED HETEROSTRUCTURE CHARGE COUPLED DEVICE

[75] Inventor: Raymond A. Milano, Newbury Park, Calif.

[73] Assignee: Rockwell International Corporation, El Segundo, Calif.

[21] Appl. No.: 518,786

[22] Filed: Jul. 29, 1983

[51] Int. Cl.[4] .................. H01L 29/78; H01L 29/56; H01L 29/205; H01L 29/80

[52] U.S. Cl. .................. 357/24; 357/15; 357/16; 357/22

[58] Field of Search .............. 357/15, 16, 22, 24

[56] References Cited

U.S. PATENT DOCUMENTS 4,285,000 8/1981 Deyhimy et al. ............ 357/24 M
4,424,525 1/1984 Mimura .................... 357/15

OTHER PUBLICATIONS

Tsui et al., "Transport Properties of GaAs-AlGaAs Heterojunction Field-Effect Transistors", Appl. Phy. Lett., vol. 39 (Nov. 1, 1981), pp. 712–714.

Drummond et al., "Transport in Modulation-Doped Structures (AlGaAs/GaAs) . . . ", Appl. Phy. Lett., vol. 41 (Aug. 1, 1982), pp. 277–279.

Primary Examiner—Gene M. Munson
Attorney, Agent, or Firm—H. Fredrick Hamann; Craig O. Malin

[57] ABSTRACT

A charge couple device structure includes a thin layer of undoped $Al_xGa_{1-x}As$ as a spacer layer between an $n^+$ doped $Al_xGa_{1-x}As$ layer and an undoped GaAs layer or substrate. This multilayer, selectively doped heterostructure supports a two-dimensional electron gas at the interface of the undoped spacer layer and the GaAs layer which permits both increased dynamic range and high speed charge transfer.

6 Claims, 7 Drawing Figures

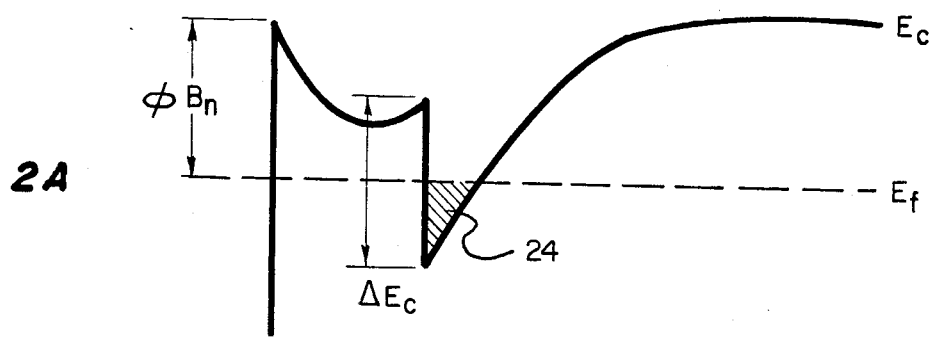
2A
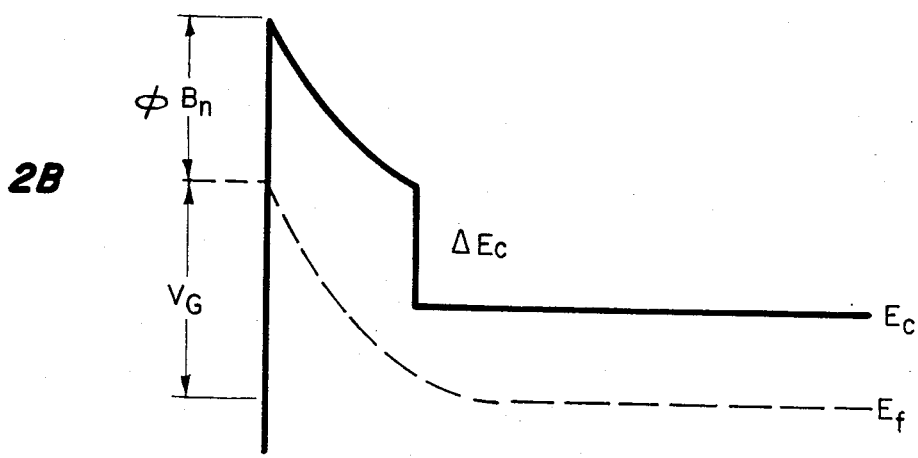
2B
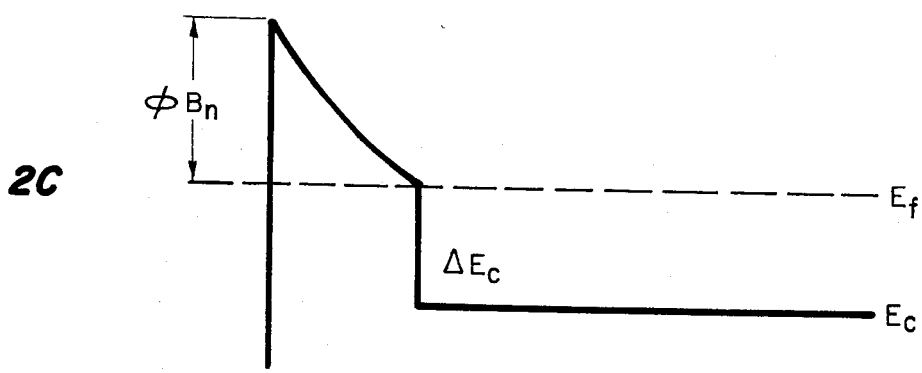
2C
Fig. 2.

MULTILAYER MODULATION DOPED HETEROSTRUCTURE CHARGE COUPLED DEVICE

BACKGROUND OF THE INVENTION

This invention relates to the field of solid state electronics and particularly to the field of charge coupled devices (CCDs).

Charge coupled devices have many promising applications such as transversal filtering and matched filtering for communication, signal multiplexing and de-multiplexing, and optical processing. These applications require high speed and good dynamic range.

Prior art CCDs utilize either surface channel designs, for example U.S. Pat. No. 3,654,499; or buried channel designs, for example U.S. Pat. Nos. 4,285,000 and 3,739,240. The surface channel CCDs have a larger total charge store, but their transfer speed is limited because the charge is held closer to the surface. The buried channel CCDs have a higher ultimate transfer speed due to fringing fields, but their total charge store is smaller. Consequently, there is a need for CCDs which have both improved speed and a large charge store.

SUMMARY OF THE INVENTION

It is an object of the invention to provide a CCD which has a high charge transfer speed.

It is an object of the invention to provide a CCD which has a large charge store capacity.

It is an object of the invention to provide a CCD which has both a high charge transfer speed and a large charge store capacity.

It is an object of the invention to provide a CCD which has a structure which is compatible with support integrated circuitry.

According to the invention, a thin spacer layer of undoped $Al_xGa_{1-x}As$ is provided between an n+ doped layer of $Al_xGa_{1-x}As$ and an undoped layer of GaAs. The thin spacer layer and the doped layer have the same bandgap, whereas the undoped GaAs layer has a smaller bandgap. Thus, a heterojunction is formed between the thin spacer layer and the GaAs layer. This multilayer, selectively doped heterostructure supports a two-dimensional electron gas (2 DEG) near the heterojunction. The 2 DEG material structure is highly localized and provides high carrier mobility at low electric fields and large storage capacity. In addition, the modulation-doped structure used for the CCD provides a good structure for the fabrication of FETs in a supporting integrated circuit.

In a second embodiment of the invention, multiperiod modulation-doped heterostructures (alternating layers of $Al_xGa_{1-x}As$ and GaAs) are provided between the gate structure and the substrate.

In a third embodiment of the invention, an undoped positioning layer is provided between the charge coupled device gate structure and the n+ doped layer. The thickness of this positioning layer is selected to optimize the efficiency of the electric field provided by the charge coupled device gate structure.

These and other objects and features of the invention will be apparent from the following detailed description taken with reference to the accompanying drawings.

BRIEF DESCRIPTION OF THE DRAWINGS

FIGS. 2A, B and C show the energy band diagram of a modulation doped heterojunction: 2A at equilibrium; 2B at reverse bias, and 2C immediately after removal of the reverse bias.

DESCRIPTION OF THE PREFERRED EMBODIMENT

Figure 1:
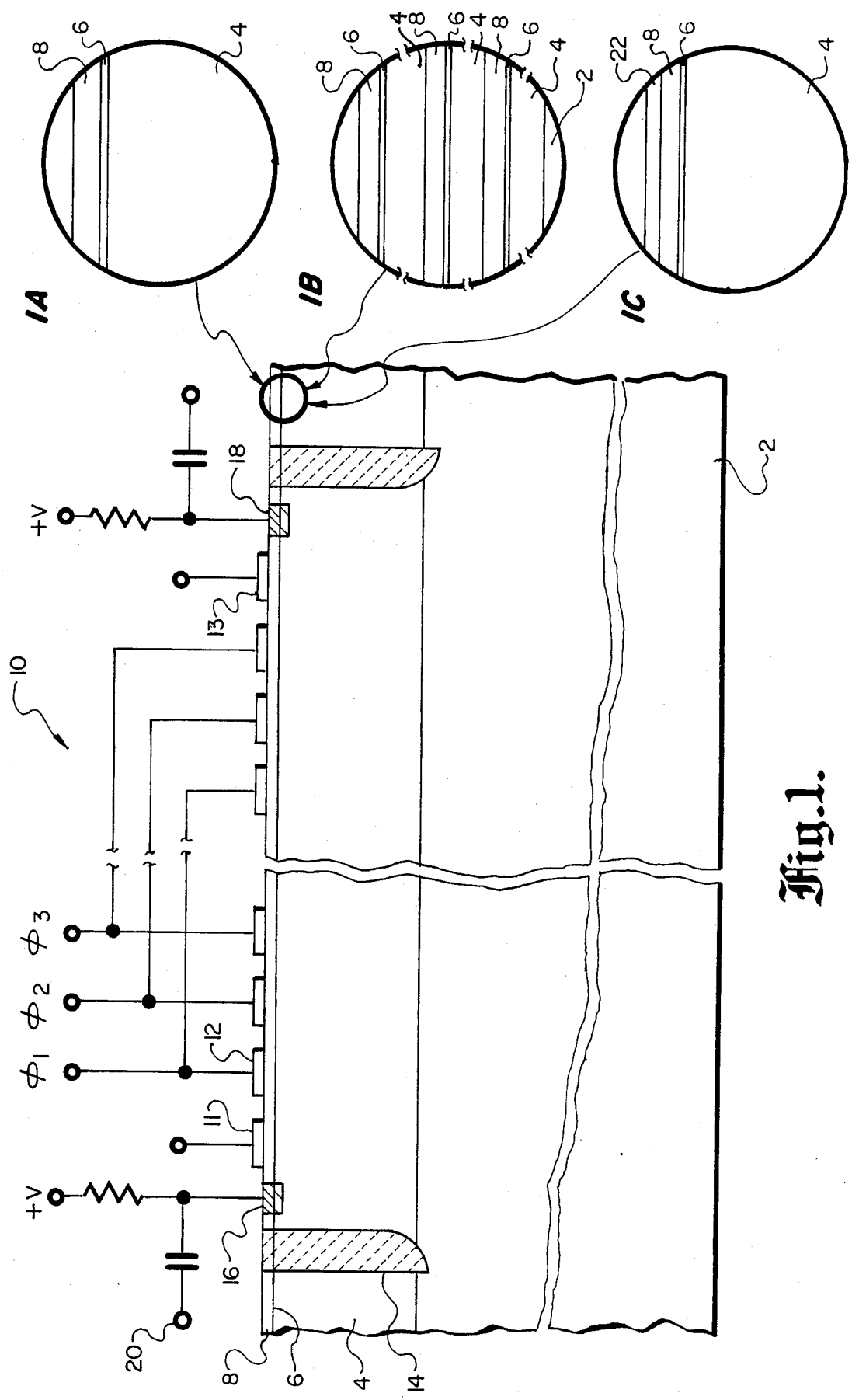
FIG. 1 is a schematic cross-section of the CCD invention utilizing a Schottky barrier gate structure. Enlarged views 1A, 1B, and 1C show three embodiments of the invention.

FIG. 1 and enlargement portion 1A illustrate a modulation-doped heterostructure CCD grown by molecular beam epitaxy on a [100] oriented undoped semi-insulating GaAs substrate 2. The structure consists of a 1 $\mu$m thick undoped GaAs layer 4, an 80 Å thick undoped $Al_{0.3}Ga_{0.7}As$ spacer layer 6, and a 400 Å thick n+$Al_{0.3}Ga_{0.7}As$ layer 8. Top layer 8 is doped to $1\times10^{18}$ cm$^{-3}$ with Si. Differential Hall mobility measurements made on this heterostructure show that $\mu_n(300k)=6100$ cm$^2$/V-sec, and $\mu_n(77K)=93,000$ cm$^2$/V-sec.

A Schottky barrier gate CCD structure 10 was fabricated on doped layer 8 using standard photolithographic techniques. The CCD structure is ten cells in length and employs a three phase clocking scheme. The input gate 11, output gate 13, and cell gates 12 are designed to be 40 $\mu$m long and 400 $\mu$m wide and to be separated by 2 $\mu$m gaps. Electron beam evaporated Cr(400 Å)/Au(400 Å) is used for the gate metallization. The CCD channel is isolated by proton bombardment 14 with a dose of $1\times10^{12}$ cm$^{-2}$ at 100 keV followed by a second implant at a dose of $1\times10^{13}$ cm$^{-2}$ at 30 keV. The second proton implant, which penetrates only 0.2 to 0.3 $\mu$m, is used to reduce the conductivity of the heavily doped $Al_{0.3}Ga_{0.7}As$ layer 8. Input and output ohmic contacts 16, 18 are formed using alloyed AuGe/Ni films.

The charge transfer process was studied using a sampled input scheme with an adjustable fat zero. A signal was injected at input 20 and the transferred signal was detected destructively at the output mode. The room temperature transfer characteristics of two successive input pulse trains separated by a variable delay time was determined to be <0.9. The difference in output signal magnitude between the two pulse trains indicates that the charge lost from the first signal partially compensates the loss mechanisms. A 40% fat zero signal added to the input pulse increases the magnitude of the output pulses without affecting the transfer efficiency. A considerable improvement in output signal magnitude and CTE is obtained when the device is operated at 77K. With no fat zero, CTE=0.987 for the initial pulse train and 0.996 for the delayed pulses. As the delay between input pulse trains is increased, the transfer efficiency of the second pulse train decreases to 0.989. By using a 40% fat zero signal, the loss is removed, and CTE=0.999 for both input signals, independent of their relative position.

In the FIG. 1A embodiment, the proximity of the charge transfer region to the surface (400 Å) is such that fringing fields do not significantly aid the transfer process. In a second embodiment of the invention, this positioning problem is reduced by including an undoped, epitaxial positioning layer 22 of $Al_{0.3}Ga_{0.7}As$ between the charge coupled device gate structure 10 and the doped $Al_{0.3}Ga_{0.7}As$ layer 8 as shown by enlargement 1C in FIG. 1. The thickness of this positioning layer is generally 0.6 μm or less and is selected to position the fringing field so that it can aid the transfer process.

Further improvement can be obtained by using multiperiod modulation-doped heterostructures such as illustrated by enlargement 1B in FIG. 1. This enlargement shows a three period structure of alternating layers of n+ doped $Al_{0.3}Ga_{0.7}As$ 8 and spacer layers of undoped $Al_{0.3}Ga_{0.7}As$ 6. Only a few periods can be used effectively, since the gate voltage required to establish the flat band condition is increased. In addition, the dispersion of the charge packet will occur due to the variation of the fringing field with distance from the surface. However, ~100 dB of dynamic range should be achievable with a three period structure.

Energy band diagrams of the depletion mode modulation-doped heterojunction Schottky barrier diode utilized in the invention are shown in FIG. 2. At equilibrium, 2A, a two-dimensional electron gas (2 DEG) 24 is present in the "notch" at the heterojunction interface. When a sufficiently large reverse bias is applied to the Schottky barrier electrode, a flat band condition is produced as shown in 2B, and no charge is present at the interface. If the bias voltage is removed, electrons can be collected under the electrode as shown in 2C. Charge transfer along the heterojunction interface occurs by applying alternating voltage signals to the closely spaced Schottky barrier electrodes.

The high carrier mobility of the two-dimensional electron gas (2 DEG) of a modulation-doped heterostructure provides the CCD of this invetion with the capability of enhanced high speed charge transfer. Increased dynamic range is obtained from the position of the charge transport interface relative to the gate structure. Additionally, this structure greatly simplifies the integration of the CCD with other electronic circuitry. High performance FETs can be fabricated on the modulation doped heterostructure making it possible to integrate them with the CCD. This is difficult to do with prior art CCDs because the channel depth and doping required for prior art CCDs is not the same as is required for high performance FETs.

Numerous variations and modifications can be made without departing from the invention. For example, other semiconductors (such as InP) and other combinations of semiconductors can be used if their lattice parameters permit an epitaxial structure, and if the proper bandgap relation is used. The spacer layer 6 and the doped layer 8 should have the same bandgap, and this bandgap should be wider than the bandgap of the undoped layer 4. $Al_xGa_{1-x}As$ compositions other than $Al_{0.3}Ga_{0.7}As$ can be used, with x representing the fractional amount of Al used. A Cr-doped GaAs substrate 2 can be used in combination with an undoped layer 4 of GaAs; or, if an undoped semi-insulating GaAs substrate is used, then thin spacer layer 6 can be grown directly on the undoped substrate.

The charge coupled device gate structure need not be a Schottky barrier gate structure as illustrated but can utilize other gate structures such as a resistive gate structure. Accordingly, it should be understood that the form of the invention described above is illustrative and is not intended to limit the scope of the claims.

What is claimed is:

1. A heterojunction charge coupled device comprising:
   a plurality of alternating layers, each of said alternating layers comprising:
   an undoped, first semiconductor;
   a thin, epitaxial spacer layer of an undoped second semiconductor on said first semiconductor, said second semiconductor having a wider band gap than said first semiconductor;
   a n+ doped epitaxial layer of a third semiconductor on said thin, epitaxial spacer layer, said third semiconductor having the same band gap as said second semiconductor; and
   a charge coupled device gate structure on said n+ doped layer of the uppermost of said alternating layers.

2. The device as claimed in claim 1 wherein said second and said third semiconductors are the same semiconducting material.

3. The device as claimed in claim 1 wherein said first semiconductor comprises undoped GaAs, said second semiconductor comprises undoped $Al_xGa_{1-x}As$, and said third semiconductor comprises n+ doped $Al_xGa_{1-x}As$.

4. The device as claimed in claim 1 including a semi-insulating substrate of a fourth semiconductor.

5. The device as claimed in claim 4 wherein said first semiconductor comprises undoped GaAs, said second semiconductor comprises undoped $Al_xGa_{1-x}As$, said third semiconductor comprises n+ doped $Al_xGa_{1-x}As$; and said fourth semiconductor comprises semi-insulating GaAs.

6. A heterojunction charge coupled device comprising:
   a substrate of semi-insulating GaAs;
   an epitaxial layer of undoped GaAs on said substrate;
   a thin, epitaxial spacer layer of undoped $Al_xGa_{1-x}As$ on said layer of undoped GaAs;
   an n+ doped epitaxial layer of $Al_xGa_{1-x}As$ on said thin spacer layer of undoped $Al_xGa_{1-x}As$;
   an undoped, epitaxial positioning layer of $Al_xGa_{1-x}As$ on said n+ doped layer; and
   a charge couple device gate structure on said positioning layer, the thickness of said positioning layer being selected to optimize the efficiency of the electric field provided by said charge coupled device gate structure.

* * * * *